United States Patent [19]

Bayraktaroglu

[11] Patent Number: 5,511,238
[45] Date of Patent: Apr. 23, 1996

[54] MONOLITHIC MICROWAVE TRANSMITTER/RECEIVER

[75] Inventor: Burhan Bayraktaroglu, Plano, Tex.

[73] Assignee: Texas Instruments Incorporated, Dallas, Tex.

[21] Appl. No.: 67,527

[22] Filed: Jun. 26, 1987

[51] Int. Cl.⁶ .................. H01P 1/15; H01Q 13/18; H04B 1/28

[52] U.S. Cl. .................. 455/81; 342/175; 343/700 MS; 331/107 DP; 331/107 SL; 333/247; 333/250

[58] Field of Search .................. 455/73, 91, 106, 455/128, 73, 77, 90, 120, 81, 129; 342/175; 33/247, 250; 343/700 MS File, 767, 772, 775; 331/107 DP, 107 SL, 108 D, 108 C

[56] References Cited

U.S. PATENT DOCUMENTS

| | | | |
|---|---|---|---|
| 3,747,109 | 7/1973 | Corbell et al. | 343/702 |
| 3,778,717 | 12/1973 | Okoshi et al. | 455/129 |
| 4,053,897 | 10/1977 | Nerheim | 343/785 |
| 4,196,393 | 4/1980 | Schweitzer | 340/600 |
| 4,251,817 | 2/1981 | Kimura et al. | 342/175 |
| 4,255,730 | 3/1981 | Sekine et al. | 333/247 |
| 4,259,743 | 3/1981 | Kaneko et al. | 455/81 |
| 4,405,925 | 9/1983 | Lindner et al. | 342/28 |
| 4,443,796 | 4/1984 | Müller | 342/28 |
| 4,521,781 | 6/1985 | Campi et al. | 343/700 MS |
| 4,569,915 | 6/1985 | Simpson | 343/700 MS X |
| 4,682,176 | 7/1987 | Jones | 342/175 |
| 4,731,611 | 3/1988 | Muller et al. | 342/28 |
| 4,908,615 | 3/1990 | Bayraktaroglu | 340/917 |

OTHER PUBLICATIONS

"JP–A–56 85 907 (Fujitsu K.K.) Jul. 13, 1981"; abstract and figure; *Patent Abstracts of Japan*, vol. 5, No. 153, (E–76) [825]; Sep. 26, 1981.

"Active Microstrip Circular Patch Antenna"; Thomas O. Perkins, III; *Microwave Journal*, pp. 109–110, 114 116–117, Mar. 1987.

"A 30–GHz Monolithic Single Balanced Mixer with Integrated Dipole Receiving Element"; Nightingale, et al.; *IEEE Transactions on Microwave Theory and Techniques*, No. 12, pp. 1603–1610, Dec. 1985.

*Primary Examiner*—John B. Sotomayor
*Attorney, Agent, or Firm*—Richard A. Stoltz; Rene E. Grossman; Richard Donaldson

[57] ABSTRACT

Preferred embodiments include a microstrip patch antenna (38) which also acts as the resonator for an oscillator powered by IMPATT diodes (34, 36); this forms a monolithic transmitter (30) for microwave and millimeter wave frequencies.

16 Claims, 6 Drawing Sheets

MONOLITHIC MICROWAVE TRANSMITTER/RECEIVER

The U.S. Government has a paid-up license in this invention and the right in limited circumstances to require the patent owner to license others on reasonable terms as provided for by the terms of Contract No. DAAL01-86-C-0002 awarded by the U.S. Army.

CROSS-REFERENCE TO RELATED APPLICATIONS

Copending U.S. application Nos. 082,027, filed Aug. 5, 1987 (Bayraktaroglu and Camelleri) and 230,205, filed Aug. 9, 1988 (Bayraktaroglu) disclose related subject matter. All of these cross-referenced applications are assigned to the assignee of this application.

BACKGROUND OF THE INVENTION

1. Field of the Invention

The present invention relates to electronic semiconductor devices, and, more particularly, to monolithic microwave and millimeter wave devices and systems.

2. Description of the Related Art

Microwave and millimeter wave transmitters are usually designed around discrete components. A transmitter requires a power source (free-running or controlled oscillator) and a radiating element (antenna); however, the technologies typically used to fabricate the oscillator and the antenna are incompatible. Thus hybrid transmitters with the oscillator and the antenna on separate substrates is standard. Monolithic millimeter wave oscillators often use IMPATT diodes with the frequency of oscillation determined by circuit impedance and specific diode conditions or by injection-locking signals; and the oscillator power is typically coupled out by a microstrip transmission line and fed into a microstrip patch or waveguide antenna. See for example R. Dinger et al. A 10 GHz Space Power Combiner with Parasitic Injection Locking, 1986 IEEE MTT Symposium Digest 163 and K. Carver et al. Microstrip Antenna Technology, 29 IEEE Tr. Ant. Prop. 2 (1981). For a transmitter operating over a band of frequencies, the antenna and the oscillator are designed for close impedance match throughout the bandwidth of operation to minimize mismatch losses.

However, the known transmitters have the problems of mismatch losses, design difficulties, and hybrid fabrication cost and difficulties.

Further, a hybrid transmitter precludes the possibility of monolithic integration of the transmitter with other devices such as mixers, detectors, capacitors, and transistors.

SUMMARY OF THE INVENTION

The present invention provides a monolithic microwave or millimeter wave transmitter/receiver with the power source its impedance matching circuits, and the radiating element on a single semiconductor chip by combining an oscillator circuit with an antenna so that the properties of these two elements match automatically. Because the oscillator and the antenna are an integrated unit, there are no mismatch losses. Further, in preferred embodiments the oscillator is a free-running IMPATT diode fabricated on a semi-insulating gallium arsenide (GaAs) substrate with a half-wavelength microstrip patch antenna also fabricated on the semi-insulating GaAs substrate; the antenna acts as a resonator for the oscillator with the dimensions of the patch determining both the frequency of oscillation and the frequency of radiation for automatic matching. The diodes perform the local oscillator and mixer functions for signals received by the antenna. Other active devices such as mixer diodes, transistors and passive circuit elements such as capacitors, resistors, inductors, directional couplers and transmissions lines may also be integrated on the same semi-insulating GaAs substrate to form monolithic systems useful in microwave/millimeter wave radars and communication systems.

The use of an antenna also as a resonator for an oscillator solves the problems of mismatch of the oscillator with the antenna and permits integration of the antenna and oscillator on a single substrate.

BRIEF DESCRIPTION OF THE DRAWINGS

The drawings are schematic for clarity.

DESCRIPTION OF THE PREFERRED EMBODIMENTS

Figure 1A:
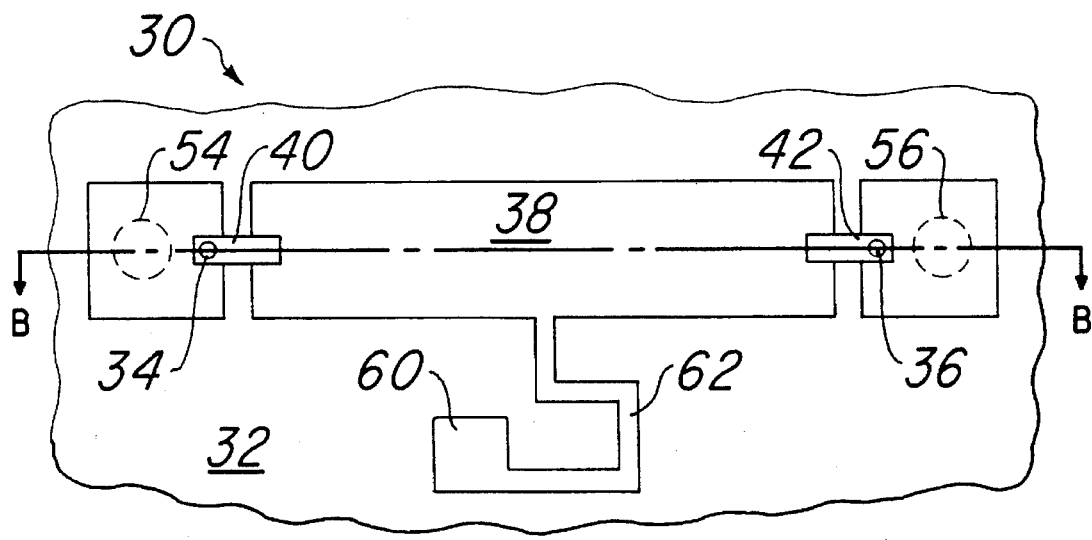
FIGS. 1A–B are plan and cross sectional elevation views of a first preferred embodiment.
Figure 1B:
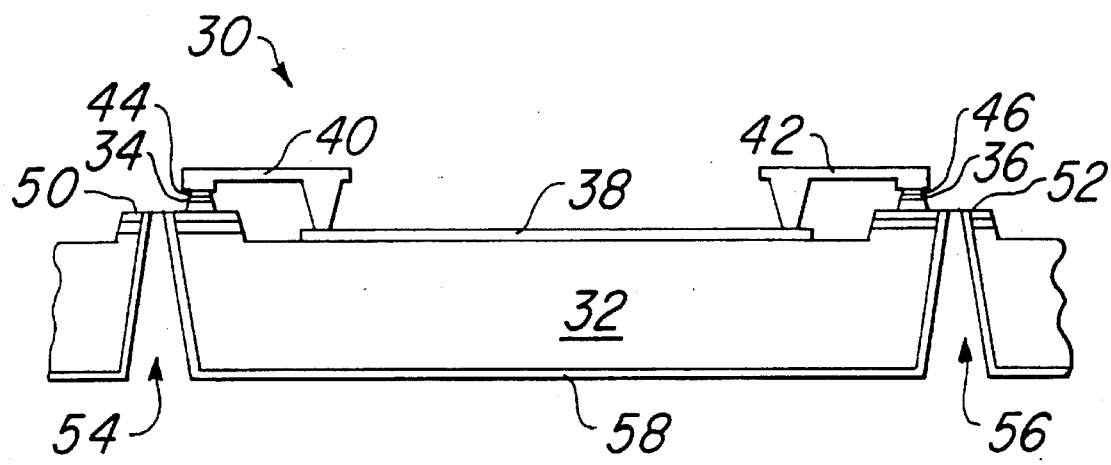

FIGS. 1A–B are plan and cross sectional elevation views of a first preferred embodiment transmitter, generally denoted with the reference numeral 30, which includes semi-insulating gallium arsenide (GaAs) substrate 32, IMPATT diodes 34 and 36, half-wavelength microstrip patch 38, air bridges 40 and 42 connecting diodes 34 and 36 to patch 38, respectively, metal top contacts 44 and 46 for diodes 34 and 36, respectively, metal bottom contacts 50 and 52 for diodes 34 and 36, respectively, metallized vias 54 and 56 connecting backside ground plane 58 to bottom contacts 50 and 52, respectively, and diode bias pad 60 connected to the middle of patch 38 by quarter-wavelength long high impedance microstrip line 62. For operation about 50 GHz. patch 38 is about 1 mm long (horizontal direction in FIGS. 1A–B) by about 125 μm wide by 2 μm thick substrate 32 is 125 μm thick. diodes 34 and 36 are each 5 μm in diameter and 1.2 μm high, and air bridges 40 and 42 are about 20 μm long and 5 μm wide so the horizontal separation of patch 38 from the diodes 34 and 36 is about 10 μm. Patch 38 together with ground plane 58 form the antenna as a cavity that radiates. The direct, current to bias diodes 34 and 36 into breakdown is supplied at pad 60; note that the dominant mode in the antenna has an electric field null in the middle where line 62 connects to patch 38 so minimal power loss occurs due to the bias arrangement.

Figure 2:
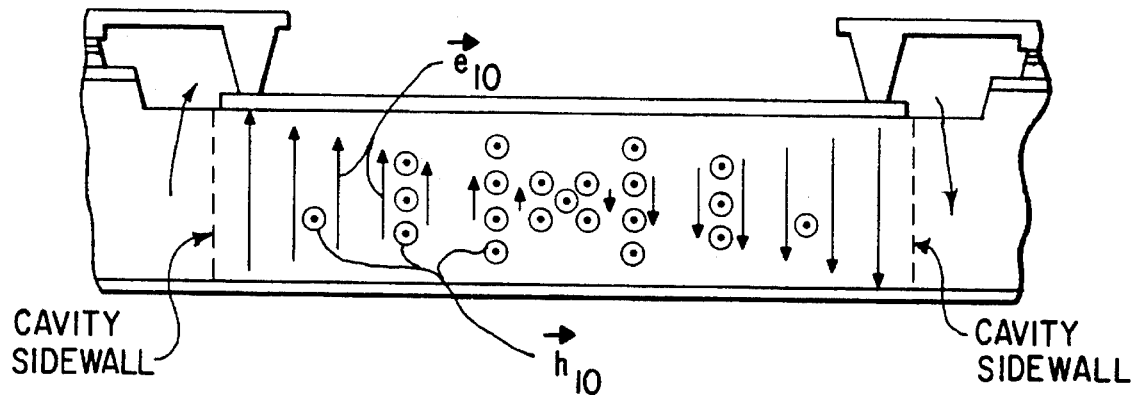
FIG. 2 is a cross sectional elevation view illustrating the electric and magnetic fields in the first preferred embodiment.

Analysis of a general rectangular microstrip patch antenna may be made using a modal-expansion cavity model if the substrate is electrical thin; see the K. Carver et al reference cited in the Background. The operation of transmitter 30 may be explained by first applying this general analysis that views patch 38 over ground plane 58 as a thin TM-mode cavity with magnetic sidewalls. Substrate 32 is electrically thin (125 μm thick with a dielectric constant of 12.9) compared to the length of patch 38; so the electric field between patch 38 and ground plane 58 will be approximated as z-directed if x and y are the coordinates in the plane of patch 38. Thus the interior modes will be $TM_{mn}$ to z so that $$\vec{E} = \sum_{m,n} c_{m,n} \vec{e}_{m,n}(x,y)$$

where $c_{m,n}$ are the mode amplitudes and $\vec{e}_{m,n}(x, y)$ are the z-directed orthonormalized electric field mode vectors. If the cavity is nonradiating with open-circuit sidewalls, then $$\vec{e}_{0,0}(x,y) = \vec{k} \frac{1}{\sqrt{\epsilon abt}}$$

$$\vec{e}_{m,0}(x,y) = \vec{k} \frac{\sqrt{2}}{\sqrt{\epsilon abt}} \cos(m\pi y/b) \quad m \neq 0$$

$$\vec{e}_{0,n}(x,y) = \vec{k} \frac{\sqrt{2}}{\sqrt{\epsilon abt}} \cos(n\pi x/a) \quad n \neq 0$$

$$\vec{e}_{m,n}(x,y) = \vec{k} \frac{2}{\sqrt{\epsilon abt}} \cos(n\pi x/a)\cos(m\pi y/b) \quad m,n \neq 0$$

with x and y coordinate axes along the edges of patch 38, a the width of patch 38, b the length of patch 38, t the thickness of substrate 32, and ϵ the dielectric constant. The corresponding magnetic field orthonormalized mode vectors. $\vec{h}_{m,n}(x,y)$ are proportional to $$\vec{i}(m\pi/b)\cos(n\pi x/a)\sin(m\pi y/b) + \vec{j}(n\pi/a)\sin(n\pi x/z)\cos(m\pi y/b)$$

so $\vec{h}_{m,n}$ is normal to the cavity sidewalls as required for no radiation. FIG. 2 schematically illustrates the electric and magnetic fields for the $TM_{10}$ mode along the same cross section as FIG. 1B; the cavity sidewalls are indicated by dashed lines.

As the cavity is allowed to radiate, the mode wave numbers become complex, $\vec{h}_{m,n}$ develops a tangential component on the cavity sidewalls, but the electric field mode vectors are still accurately approximated by the $\vec{e}_{m,n}$ with the complex wave numbers $k_n$ and $k_m$ replacing $n\pi/a$ and $m\pi/b$. $|k_n|$ is slightly less than $n\pi/a$ and $|k_m|$ is slightly less than $m\pi/b$; thus the $TM_{10}$ mode radiates with a wavelength slightly greater than $2b\sqrt{\epsilon}$. When the loading of diodes 34 and 36 is included, the wavelength further slightly increases.

Figure 3:
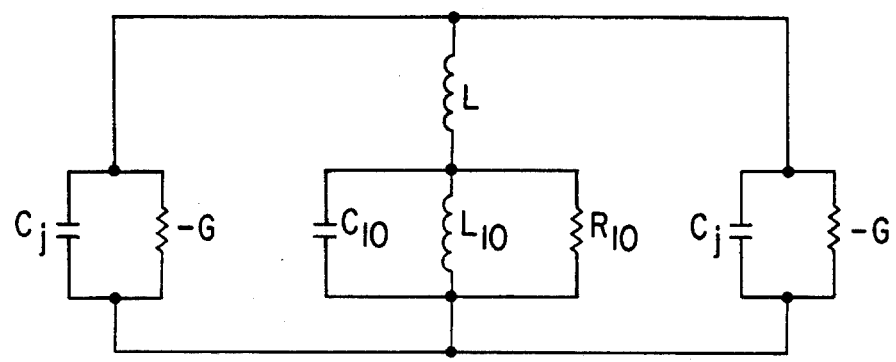
FIG. 3 is a schematic equivalent circuit for the first preferred embodiment.

The input impedance for the radiating cavity can be approximated by considering a current probe-at one of air bridges 40 and 42 and computing the series expansion coefficients for $\vec{E}$ with approximate electric mode vectors. The result (see the Carver et al article) is a sum over $m \geq 0$ and $n \geq 0$; the $(0,0)$ term is the static capacitance with a shunt resistance to represent loss in substrate 32, the $(1,0)$ term represents the dominant microwave mode and has spatial variation approximated by the nonradiating $\vec{e}_{1,0}$ (which varies as $\cos(\pi y/b)$ along the length of patch 38 and is constant across the width), and the higher order modes have negligible losses and sum to form a net inductance L. The $(1,0)$ mode term is equivalent to a parallel R-L-C network where R represents radiation, substrate, and conductor losses. FIG. 3 is a schematic equivalent circuit for transmitter 30 over a narrow band about an isolated $TM_{10}$ mode in which the antenna has been replaced by this input, impedance (labelled with subscripts 10 for the R-L-C of the $(1,0)$ mode) and each of the diodes 34 and 36 has been replaced by an equivalent negative conductance $-G$ plus a junction capacitance $C_j$. The resonant frequency occurs when the inductances and capacitances cancel and $R_{10}-2G=0$: that is the power generated by diodes 34 and 36 is absorbed by $R_{10}$ which is primarily the radiation resistance (i.e., it is radiated).

The design of transmitter 30, given the substrate material and thickness and a desired frequency, f, generally follows the steps of (1) selecting the length b of patch 38 as half of the desired wavelength multiplied by a length reduction factor q to account for fringing fields and the loading by diodes 34 and 36:

$$b = q \frac{c}{2f\sqrt{\epsilon}},$$

(2) selecting the width a of patch 38 by computing an approximate cavity sidewall impedance as a function of a and adjusting a so that this impedance matches the free space impedance of 377 Ω, and (3) computing the Q of the cavity; if the Q is too low the resonator effect is poor and if the Q is too high the antenna is not efficient. To change the Q requires revising the original substrate thickness data provided that the same substrate material and frequency of operation are still desired. If the substrate thickness is adjusted, then b and a are recomputed.

In practice, computer simulations such as SUPERCOMPACT for a variety of a and b values compute oscillation frequency and antenna efficiency and, in effect, design the transmitter. Note that if the frequency is very high (100 GHz) the permitted effective thickness of the substrate is limited by the rule of thumb of demanding that the second harmonic is still a TM mode and not, a surface mode. A thin substrate implies small a. Although a substrate with a smaller dielectric constant (such as Teflon with constant about 2.4) and lower loss tangent than GaAs would be preferable from a pure antenna point of view, GaAs is a compromise that permits monolithic integration of the diodes and antenna plus other devices.

The far-field radiation pattern in the $TM_{10}$ mode can be modelled as two parallel uniform magnetic line sources of length a (corresponding to the short ends of patch 38) separated by distance b (the length of patch 38).

Figure 4A:
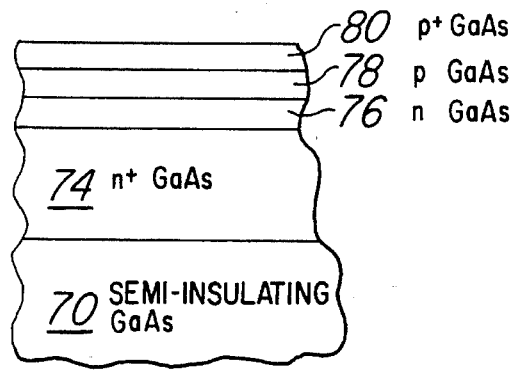
FIGS. 4A–F are cross sectional elevation views of a first preferred embodiment method of fabrication of the first preferred embodiment.

Further characteristics of transmitter 30 may be understood from a consideration of a first preferred embodiment method of fabrication which includes the following steps:

(a) Grow a single crystal semiconductor multilayer structure 66 by molecular beam epitaxy (MBE), metal organic chemical vapor deposition (MOCVD), or similar techniques beginning with gallium arsenide (GaAs) substrate 70 and adding successive layers with composition, thickness, and doping level as set forth in the following table; see FIG. 4A for a cross sectional view.

| Layer | Composition | Thickness | Doping (cm$^{-3}$) |
|---|---|---|---|
| 70 | GaAs | large | undoped |
| 74 | n$^+$ GaAs | 1.5 μm | $1 \times 10^{19}$ |
| 76 | n GaAs | 0.25 μm | $2 \times 10^{17}$ |
| 78 | p GaAs | 0.25 μm | $2 \times 10^{17}$ |
| 80 | p$^+$ GaAs | 0.2 μm | $1 \times 10^{19}$ |

Note that MBE and MOCVD with in situ doping provides very sharp junctions between the drift layers 78 and 80; this avoids the fall off of negative conductance at high frequencies associated with a doping transition region at the junction. GaAs substrate 70 is semi-insulating.

Figure 4B:
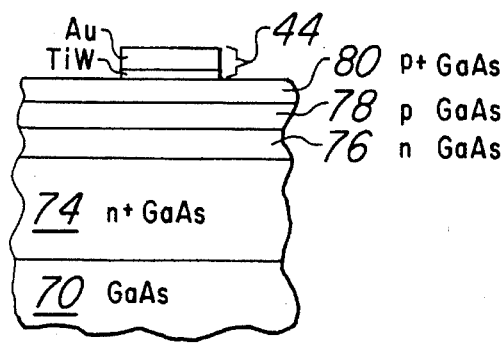

(b) Form diode top contacts 44 and 46 by spinning on photoresist and patterning it to define contacts 44 and 46 as circles 5 μm in diameter, sputtering 0.1 μm of TiW (an alloy of about 10% titanium and 90% tungsten) and 0.4 μm of gold, and etching off around the patterned photoresist so as to leave contacts 44 and 46. See FIG. 4B which only shows contact 44. The gold is primarily to prevent oxidization of the TiW, and the TiW chosen for its good adherence to and low metallurgical reaction with GaAs.

Figure 4C:
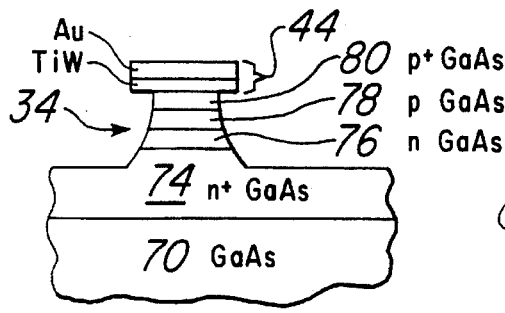

(c) Etch layers 80, 78, 76, and 74 with contact 44 as the etch mask by a timed wet etching to stop in layer 74: this forms diodes 34 and 36 with a base diameter of 5 μm. The etchant may be a solution of hydrogen peroxide with five percent ammonium hydroxide, and the large thickness of layer 74 allows for ease of stopping the etch in layer 74. The isotropic nature of this etch leads to an overhang by contact 44; see FIG. 4C and note that the vertical scale is exaggerated for clarity so the characteristic circular isotropically etched surface under the overhang appears pyramidal.

Figure 4D:
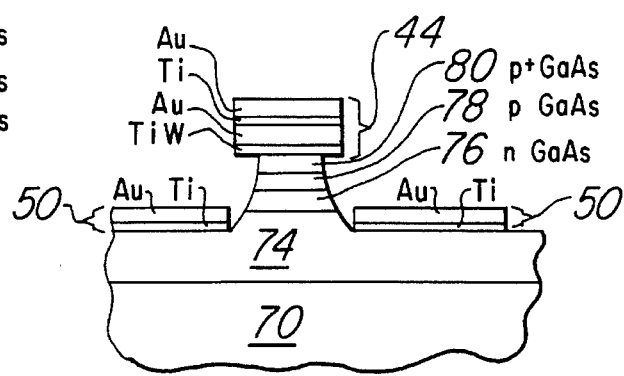

(d) Form diode bottom contacts 50 and 52 by spinning on photoresist and patterning it to define contacts 50 and 52 as squares with 75 μm edges, evaporating 0.1 μm of titanium and 0.4 μm of gold, and lifting off the patterned photoresist and the metal on it. Diode top contacts 44 and 46 act as masks during the evaporation and lead to self-aligned bottom contacts 50 and 52 due to the overhangs; see FIG. 4D. Top contacts 44 and 46 are both increased in thickness by the evaporations, and the self-aligned nature of bottom contacts 50 and 52 minimizes parasitic series resistance.

Figure 4E:
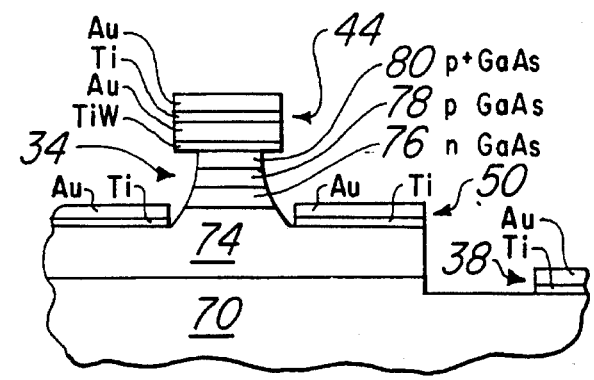

(e) Anisotropically plasma etch layer 74 and 0.1 μm of substrate 70 using the metal contacts 44, 46, 50, and 52 as etch mask. This isolates the diodes on mesas on semi-insulating substrate 70. Form microstrip patch 38 on substrate 70 again by evaporation and liftoff of a 0.1 μm thick layer of titanium followed by a 0.4 μm thick layer of gold. See FIG. 4E which shows the just diode 34 and a small portion of patch 38.

Figure 4F:
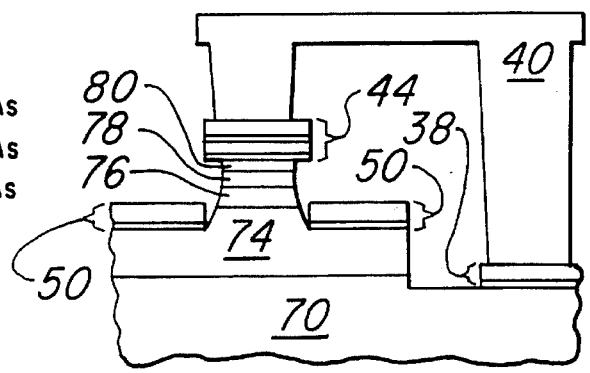

(f) Form air bridges 40 and 42 by spinning on photoresist, patterning openings to contacts 44 and 46, evaporating thin layers of titanium and gold, spinning on futher photoresist; patterning the same openings plus the bridging connections between the openings, and plating gold to a thickness of 2.0 μm on the exposed gold. Remove the photoresist which also liftsoff the thin titanium and gold between the two layers of photoresist. See FIG. 4F.

(g) Lap substrate 70 down to a thickness of 125 μm to form substrate 32. Form vias 54 and 56 in the backside of substrate 32 by photoresist masking and reactive ion etching, the etch stops on bottom contacts 50 and 52. Lastly, gold plate the backside, including vias 54 and 56 to form ground plane 58.

Other devices may also be integrated on substrate 70 just prior to formation of patch 38 in step (e). In particular, active device regions may be implanted in the semi-insulating substrate 70 away from diodes 34 and 36 and the area for patch 38. Alternatively, additional photolithographic masking may be-used in the etching of layer 74 step (e) to preserve regions of n⁻ doped GaAs for device fabrication.

Figure 5A:
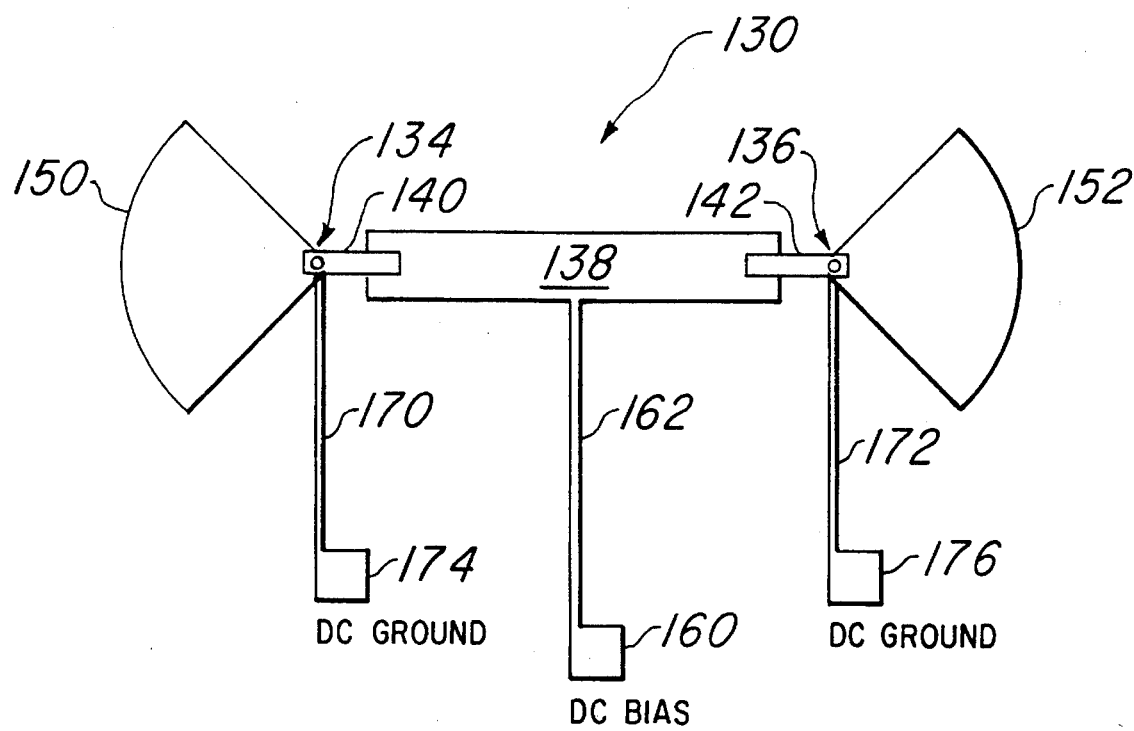
FIGS. 5A–B are plan and cross sectional elevation views of a second preferred embodiment.
Figure 5B:
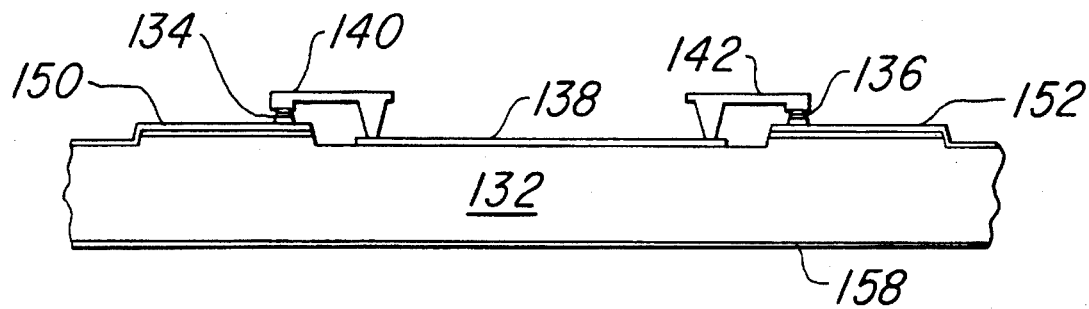

Second preferred embodiment transmitter 130 is illustrated in plan and cross sectional elevation views in FIGS. 5A–B. Transmitter 130 is similar to transmitter 30 with two IMPATT diodes 134 and 136 at either end of microstrip patch 138 which acts as both an antenna and a resonator. The via grounding of the diodes in transmitter 30 has been replaced by separate grounding of the dc and rf impedances of the diodes: the bottom diode contacts 150 and 152 are shaped into radial stubs to produce an effective rf short circuit impedance at the diode terminal and two dc return paths 170 and 172 of halfwavelength long high impedance transmission line lead to dc grounded pads 174 and 176. DC bias is from pad 160 through halfwavelength high impedance transmission line 162 to the center of patch 138; air bridges 140 and 142 connect diodes 134 and 136 to patch 138. Radial stubs 150 and 152 should have properties matching those of resonator 138 in the frequency range of operation; however, this is easily achieved because radial stubs generally operate over a broad band of frequencies. The backside of substrate 132 is gold-plated ground plane 158.

The preferred embodiments also function as receivers. The diodes provide the local oscillator (LO) and mixer functions, whereas the resonator/antenna is used for receiving and modifying the impedance of incoming signals for optimum reception sensitivity. The low frequency mixed signal is taken out along the dc bias line. Further, the embodiments may operate in a pulsed transmit/receive mode as follows: first the diodes are biased for power generation at a frequency $f_1$ and a pulse is transmitted at this frequency:, then the diode bias is changed (which changes the diode small signal conductance and susceptance) to change the resonant frequency to $f_2$. The antenna then receives a signal arising from the reflection of the transmitted pulse at $f_1$ which is mixed by the diodes (which are nonlinear) with $f_2$ to create the output signal.

Figure 6:
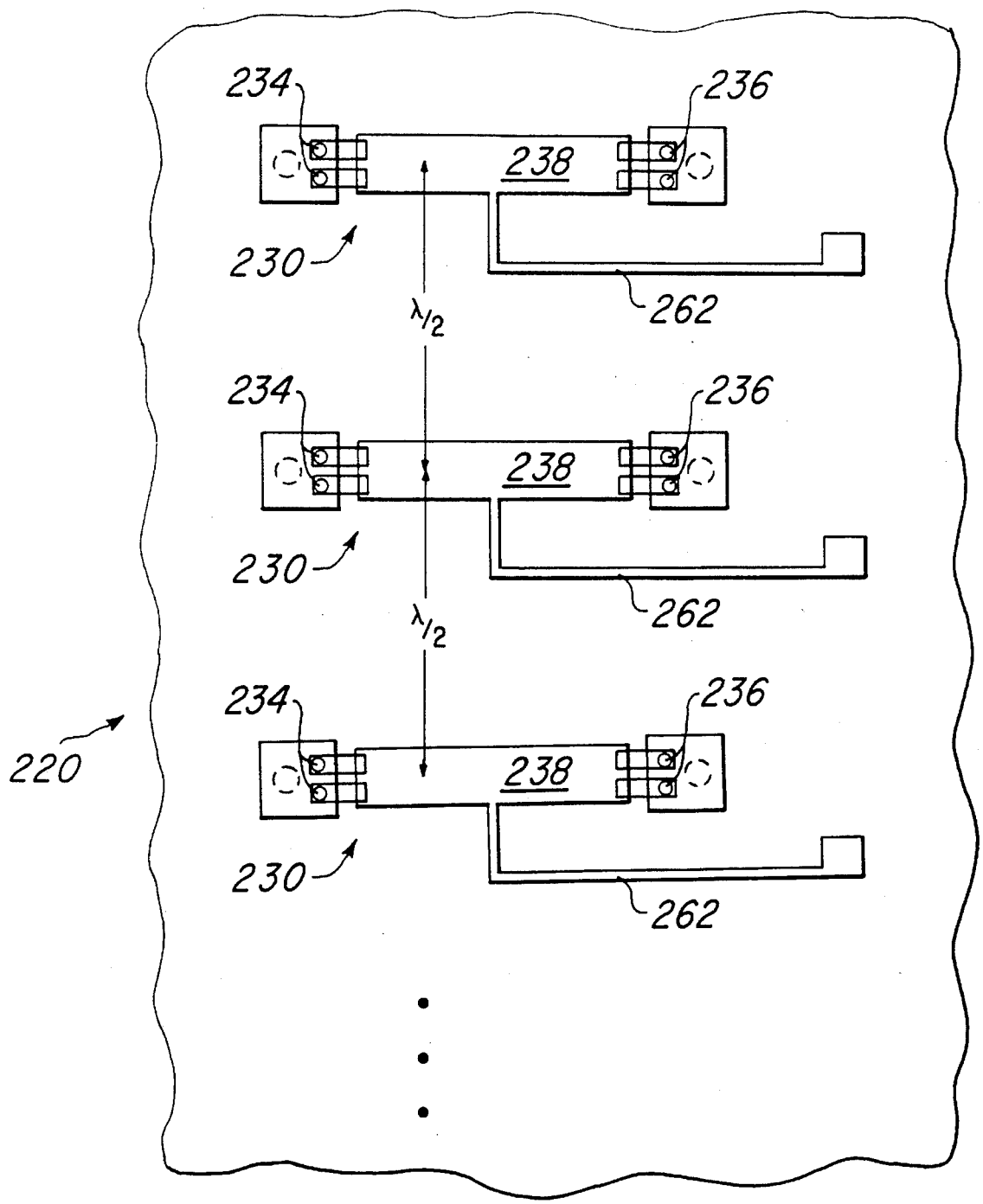
FIG. 6 is a plan view of a third preferred embodiment.

A third preferred embodiment transmitter 220 is illustrated in plan view in FIG. 6 and combines a number of identical monolithic transmitters 230. Each transmitter 230 is similar to transmitter 30 but with two diodes 234, 236 at each end of its microstrip patch 238 and with an independent dc bias line 262 for each transmitter; transmitters 230 are in a linear array on a single semiconductor surface. By placing the patches 238 on a center-to-center distance of about ½λ, where λ is the free space wavelength, the radiated beam is perpendicular to the semiconductor surface. The phasing of the individual transmitters 230 is achieved by coupling through the fringing fields; this provides spatial power combining and coherent power. Because each transmitter 230 has its own biasing capability, relative strength of radiation from each transmitter 230 can be controlled independently for convenient beam steering and shaping.

Figure 7:
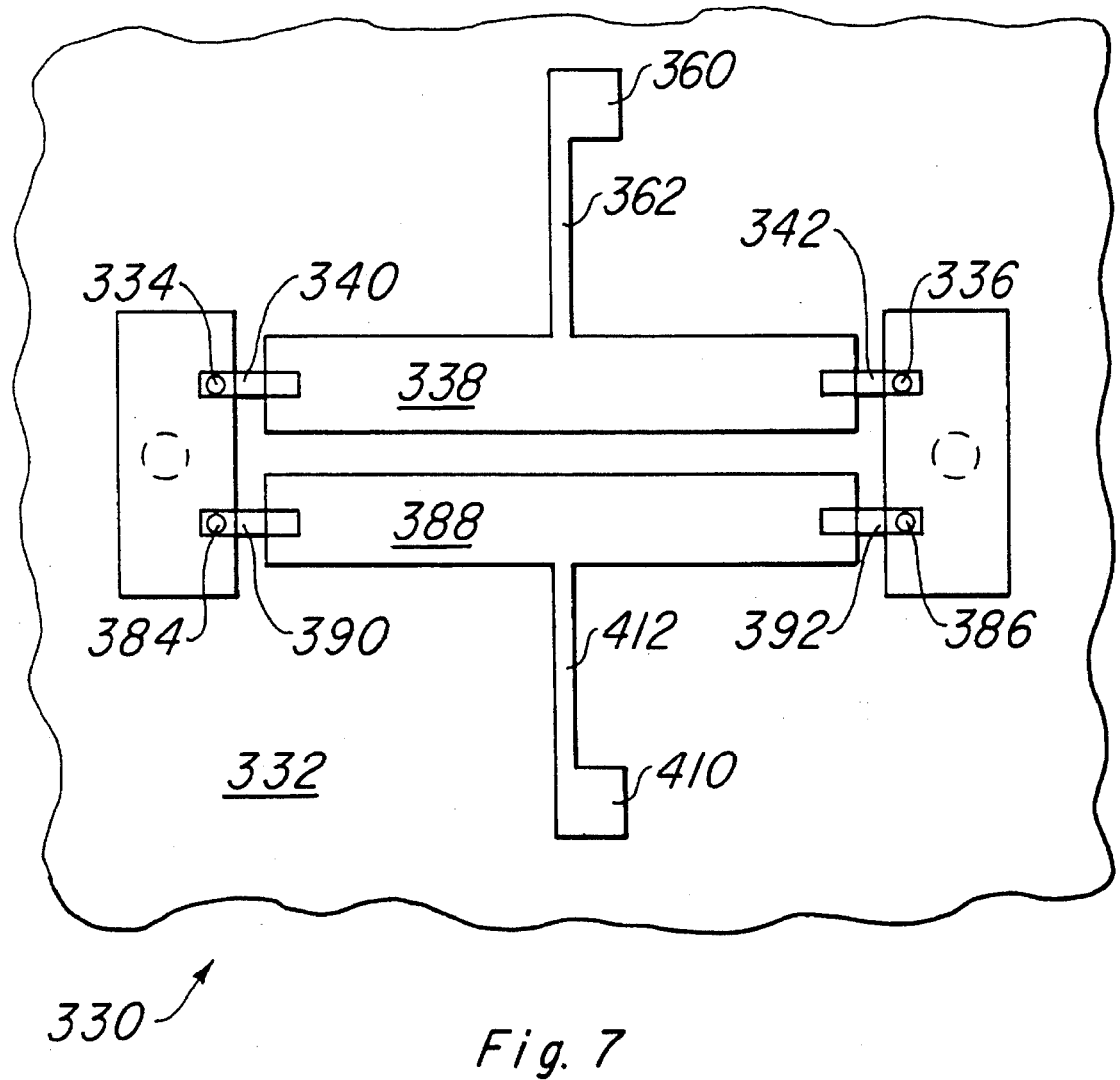
FIG. 7 is a plan view of a fourth preferred embodiment.

Fourth preferred embodiment transmitter 330 is illustrated in plan view in FIG. 7 and is similar to two transmitters 30 with one acting as a transmitter and the other acting as a varactor to permit control of the frequency of oscillation. Transmitter 330 includes IMPATT diodes 334 and 336, microstrip patch resonator/antenna 338, air bridges 340 and 342 connecting diodes 334 and 336 to patch 338, high impedance dc bias line 362, dc bias supply pad 360, varactor diodes 384 and 386 connected by air bridges 390 and 392 to microstrip patch 388, high impedance dc bias line 412, dc bias supply pad 410. During operation of transmitter 330 diodes 334 and 336 are biased into breakdown and provide power to resonator/antenna 338; whereas diodes 384 and 386 are biased below breakdown with their junction capacitance dependent upon the bias voltage and providing variable capacitive loading for patch 338 through the coupling of patch 388 with patch 338. Thus the bias applied at pad 410 determines the frequency of oscillation, typically with a range of about 30% about the center frequency. Patches 338 and 388 are separated by no more than about ¹⁄₁₆λ for strong coupling.

Transmitter 330 also performs as a receiver in the manner of the other preferred embodiments previously described, but transmitter 330 also has the capability of modulating the frequency for FMCW radar transmitting and receiving.

MODIFICATIONS AND ADVANTAGES

Various modifications of the preferred embodiment devices and methods may be made while retaining the features of an antenna that is also the oscillator resonator or of a planar transmitter circuit in which the power generating device is on the same surface of semiconductor as the radiating element while maintaining strong dc and rf grounding of one of the device terminals.

For example, the dimensions and shapes and materials of the various elements may be varied such as: circular or other geometry microstrip patches; only a single diode connected to the resonator/antenna if the capacitance of the diode is small compared to the capacitance of the resonator to retain approximate symmetry; multiple diodes connected to either or both ends of the resonator/antenna; GaAs-on-silicon, InP, $Al_xGa_{1-x}As$ heterostructure or other semiconductor material; other power devices including BARITT, TRAPATT, and DOVETT diodes, Gunn diodes, tunnel diodes or three terminal devices with negative resistance regions, or other monolithic active devices for oscillator power; and monolithic coupled arrays of oscillators/antennas.

The invention provides the advantage of use of the oscillator resonator as the antenna to avoid mismatch losses and permit monolithic integration.

What is claimed is:

1. A microwave transmitter comprising:
   (a) an oscillator, said oscillator including:
   (i) a power source, and
   (ii) a resonator
   (iii) said resonator simultaneously functioning as an antenna; wherein:
   (iv) said power source is a plurality of diodes;
   (v) said resonator is a microstrip patch;
   (vi) said diodes and patch are formed on a single semiconductor substrate; and
   (vii) at least two of said plurality of diodes are connected to opposite edges of said patch.

2. The transmitter of claim 1, wherein:
   (a) said substrate is gallium arsenide with a metallized ground plane on the backside;
   (b) said diodes are formed on mesas on said substrate;
   said diodes are connected to said patch by air bridges; and
   (d) said diodes are connected to said ground plane through vias in said substrate.

3. The transmitter of claim 1, wherein:
   (a) said substrate is gallium arsenide with a metallized ground plane on the backside;
   (b) said diodes are formed on mesas on said substrate;
   (c) said diodes are connected to said patch by air bridges; and
   (d) said diodes are connected to ground through radial stubs and dc bias lines.

4. A microwave transmitter comprising:
   (a) an oscillator, said oscillator including:
   (b) a power source comprising a plurality of IMPATT diodes biased into breakdown,
   (c) a resonator comprising a microstrip patch, said diodes and patch being disposed on a single semiconductor substrate,
   (d) said resonator simultaneously functioning as an antenna,
   (e) further comprising: a second microstrip patch adjacent said resonator patch; and
   (f) a varactor connected to said second patch and loading said resonator patch.

5. The transmitter of claim 4, wherein:
   (a) said substrate is gallium arsenide with a metallized ground plane on the backside:
   (b) said varactor is a diode;
   (c) said diodes are formed on mesas on said substrate;
   (d) said IMPATT diodes are connected to said resonator patch by air bridges:
   (e) said varactor diodes are connected to said second patch by air bridges; and
   (f) said diodes are connected to said ground plane through vias in said substrate.

6. The transmitter of claim 4, wherein:
   (a) said substrate is gallium arsenide with a metallized ground plane on the backside;
   (b) said varactor is a diode;
   (c) said diodes are formed on mesas on said substrate;
   (d) said IMPATT diodes are connected to said resonator patch by air bridges;
   (e) said varactor diodes are connected to said second patch by air bridges; and
   (f) said diodes are connected to ground by radial stubs and dc bias lines.

7. An array microwave transmitter, comprising:
   (a) a plurality of individual transmitters on a semiconductor substrate;
   (b) each of said individual transmitters including:
   i. an oscillator, said oscillator including:
   ii. a power source and
   iii. a resonator,
   iv. said resonator simultaneously functioning as an antenna; wherein:
   v. said power source is a plurality of diodes;
   vi. said resonator is a microstrip patch;
   vii. said diodes and patch are formed on a single semiconductor substrate; and
   viii. at least two of said plurality of diodes are connected to opposite edges of said patch.

8. The transmitter of claim 7, wherein:
   each of said plurality of individual transmitters is separated by a distance approximately equal to a half-wavelength of the desired operating frequency of said array.

9. The transmitter of claim 7 wherein:
   (a) said substrate is gallium arsenide with a metallized ground plane on the backside;
   (b) said diodes are formed on mesas on said substrate;
   (c) said diodes are connected to the corresponding said patch by air bridges; and
   (d) said diodes are connected to said ground plane through vias in said substrate.

10. The transmitter of claim 7, wherein:
    (a) said substrate is gallium arsenide with a metallized ground plane on the backside;
    (b) said diodes are formed on mesas on said substrate;
    (c) said diodes are connected to said patch by air bridges; and
    (d) said diodes are connected to ground through radial stubs and dc bias lines.

11. A transmitter/receiver, comprising:
(a) an oscillator, said oscillator including:
(b) a power source and
(c) a resonator,
(d) said resonator simultaneously functioning as an antenna;
(e) a low frequency line connected to said resonator to mix signals received by said antenna by said power source to a low frequency; wherein:
(f) said power source is a plurality of;
(g) said resonator is a microstrip patch;
(h) said diodes and patch are formed on a single semiconductor substrate; and
(i) at least two of said plurality of diodes are connected to opposite edges of said patch.

12. The transmitter/receiver of claim 11, wherein:
(a) said substrate is gallium arsenide with a metallized ground plane on the backside;
(b) said diodes are formed on mesas on said substrate;
(c) said diodes are connected to said patch by air bridges; and
(d) said diodes are connected to said ground plane through vias in said substrate.

13. The transmitter/receiver of claim 11, wherein:
(a) said substrate is gallium arsenide with a metallized ground plane on the backside;
(b) said diodes are formed on mesas on said substrate;
(c) said diodes are connected to said patch by air bridges; and
(d) said diodes are connected to ground through radial stubs and dc bias lines.

14. A transmitter/receiver, comprising:
(a) an oscillator, said oscillator including:
(b) a power source comprising a plurality of IMPATT diodes biased into breakdown, and
(c) a resonator comprising a microstrip patch, said diodes and patch being disposed on a single semiconductor substrate,
(d) said resonator simultaneously functioning as an antenna,
(e) a low frequency line connected to said resonator to mix signals received by said antenna by said power source to a low frequency,
(f) further comprising: a second microstrip patch adjacent said resonator patch; and
(g) a varactor connected to said second patch and loading said resonator patch.

15. The transmitter/receiver of claim 14, wherein:
(a) said substrate is gallium arsenide with a metallized ground plane on the backside;
(b) said varactor is a diode;
(c) said diodes are formed on mesas on said substrate;
(d) said IMPATT diodes are connected to said resonator patch by air bridges;
(e) said varactor diodes are connected to said second patch by air bridges; and
(f) said diodes are connected to said ground plane through vias in said substrate.

16. The transmitter/receiver of claim 14, wherein:
(a) said substrate is gallium arsenide with a metallized ground plane on the backside;
(b) said varactor is a diode;
(c) said diodes are formed on mesas on said substrate;
(d) said IMPATT diodes are connected to said resonator patch by air bridges;
(e) said varactor diodes are connected to said second patch by air bridges; and
(f) said diodes are connected to ground by radial stubs and dc bias lines.

* * * * *